US012159877B2

(12) United States Patent
Li

(10) Patent No.: US 12,159,877 B2
(45) Date of Patent: Dec. 3, 2024

(54) SELF-LUMINOUS DISPLAY PANEL

(71) Applicant: TCL CHINA STAR OPTOELECTRONICS TECHNOLOGY CO., LTD., Shenzhen (CN)

(72) Inventor: Yan Li, Shenzhen (CN)

(*) Notice: Subject to any disclaimer, the term of this patent is extended or adjusted under 35 U.S.C. 154(b) by 585 days.

(21) Appl. No.: 17/050,845

(22) PCT Filed: Sep. 7, 2020

(86) PCT No.: PCT/CN2020/113748
§ 371 (c)(1),
(2) Date: Oct. 27, 2020

(87) PCT Pub. No.: WO2022/032775
PCT Pub. Date: Feb. 17, 2022

(65) Prior Publication Data
US 2022/0077192 A1 Mar. 10, 2022

(30) Foreign Application Priority Data
Aug. 10, 2020 (CN) .......................... 202010796700.1

(51) Int. Cl.
*H01L 27/12* (2006.01)
*G09G 3/20* (2006.01)
*G09G 3/32* (2016.01)

(52) U.S. Cl.
CPC .......... *H01L 27/124* (2013.01); *G09G 3/2007* (2013.01); *G09G 3/32* (2013.01); *H01L 27/1255* (2013.01); *G09G 2300/0842* (2013.01); *G09G 2330/00* (2013.01)

(58) Field of Classification Search
CPC . H01L 27/124; H01L 27/1255; G09G 3/2007; G09G 3/32; G09G 2300/0842; G09G 2330/00
USPC ............................................................ 257/71
See application file for complete search history.

(56) References Cited

U.S. PATENT DOCUMENTS

| | | | |
|---|---|---|---|
| 6,356,029 B1 * | 3/2002 | Hunter | G09G 3/3233 315/169.3 |
| 10,170,534 B1 | 1/2019 | Kim et al. | |
| 2003/0201729 A1 * | 10/2003 | Kimura | G09G 3/3233 315/169.3 |
| 2009/0102759 A1 * | 4/2009 | Kawabe | G09G 3/3258 345/76 |

(Continued)

FOREIGN PATENT DOCUMENTS

| CN | 105976764 A | 9/2016 |
|---|---|---|
| CN | 107887421 A | 4/2018 |

(Continued)

*Primary Examiner* — Ori Nadav

(57) ABSTRACT

A self-luminous display panel is provided. The self-luminous display panel includes a power supply film layer. The power supply film layer is divided into a plurality of mutually insulated power supply blocks, and each power supply block is electrically connected to a plurality of pixel circuits located in the power supply block. A high grayscale display is independently provided for the corresponding pixel circuits by dividing the power supply film into power supply blocks, thereby easily achieving the partition display of the self-luminous display panel.

14 Claims, 2 Drawing Sheets

(56) References Cited

U.S. PATENT DOCUMENTS

| | | | |
|---|---|---|---|
| 2009/0322216 A1* | 12/2009 | Yanagihara | H10K 59/179 |
| | | | 313/504 |
| 2016/0035264 A1* | 2/2016 | Fujii | G09G 3/3233 |
| | | | 345/691 |
| 2018/0218670 A1 | 8/2018 | Huska et al. | |
| 2020/0194537 A1 | 6/2020 | Yang et al. | |

FOREIGN PATENT DOCUMENTS

| | | |
|---|---|---|
| CN | 108401466 A | 8/2018 |
| CN | 108986741 A | 12/2018 |
| CN | 110462849 A | 11/2019 |
| CN | 111312153 A | 6/2020 |
| CN | 111369946 A | 7/2020 |
| CN | 111477172 A | 7/2020 |

\* cited by examiner

SELF-LUMINOUS DISPLAY PANEL

FIELD OF INVENTION

The present disclosure relates to the technical field of display, and particularly, to the technical field of a self-luminous display panel, and specifically, to a self-luminous display device.

BACKGROUND OF INVENTION

In a light-emitting power provided for a pixel circuit in a self-luminous display panel, a full-surface conductive film is usually provided in the display panel, and then the conductive film is provided with a corresponding potential from the outside of the display panel. The conductive film is electrically connected to the pixel circuit through a via hole, so that in one display panel, the light-emitting power provided for all of the pixel circuits may only be at the same potential.

Limited to the full-surface design of the conductive film in the conventional technical solution, it is difficult for the present display panel to perform partition display, i.e. both low grayscale display and high grayscale display.

SUMMARY OF INVENTION

Technical Problems

The present disclosure provides a self-luminous display panel, which solves the problem that the self-luminous display panel has difficulty in performing partition display.

Technical Solutions

In a first aspect, the present disclosure provides a self-luminous display panel. The self-luminous display panel comprises a power supply film layer. The power supply film layer is divided into a plurality of mutually insulated power supply blocks. Each power supply block is electrically connected to a plurality of pixel circuits located in the power supply block. Some of the power supply blocks are supplied with a first potential, another some of the power supply blocks are supplied with a second potential, and the second potential is higher than the first potential.

Based on the first aspect, in a first embodiment of the first aspect, each pixel circuit comprises a writing unit, a memory unit, a drive unit, and a light-emitting unit. The writing unit is connected to a scan signal, a data signal, one end of the memory unit, and a control end of the drive unit. One end of the memory unit is connected to the control end of the drive unit. Zero potential is connected to the other end of the memory unit and an output end of the drive unit. An input end of the drive unit is connected to an output end of the light-emitting unit. An input end of the light-emitting unit is electrically connected to the corresponding power supply block.

Based on the first embodiment of the first aspect, in a second embodiment of the first aspect, the writing unit comprises a first thin film transistor. A drain of the first thin film transistor is connected to the data signal. A gate of the first thin film transistor is connected to the scan signal. A source of the first thin film transistor is connected to one end of the memory cell and the control end of the drive unit.

Based on the second embodiment of the first aspect, in a third embodiment of the first aspect, the memory unit comprises a storage capacitor. A first end of the storage capacitor is connected to the source of the first thin film transistor and the control end of the drive unit, and a second end of the storage capacitor is connected to zero potential.

Based on the third embodiment of the first aspect, in a fourth embodiment of the first aspect, the drive unit comprises a second thin film transistor. A gate of the second thin film transistor is connected to the first end of the storage capacitor. A source of the second thin film transistor is connected to zero potential. A drain of the second thin film transistor is connected to the output end of the light-emitting unit.

Based on the fourth embodiment of the first aspect, in a fifth embodiment of the first aspect, the light-emitting unit comprises a light-emitting device. A cathode of the light-emitting device is connected to the drain of the second thin film transistor, and an anode of the light-emitting device is connected to the corresponding power supply block.

Based on the fifth embodiment of the first aspect, in a sixth embodiment of the first aspect, the first thin film transistor and the second thin film transistor are both N-type thin film transistors.

Based on the first aspect, in a seventh embodiment of the first aspect, a shape of the power supply block is rectangular.

Based on the first aspect, in an eighth embodiment of the first aspect, the power supply block is connected to the four corresponding pixel circuits.

In a second aspect, the present disclosure provides a self-luminous display panel. The self-luminous display panel comprises a power supply film layer. The power supply film layer is divided into a plurality of mutually insulated power supply blocks. Each power supply block is electrically connected to a different number of pixel circuits located in the power supply block. Some of the power supply blocks are supplied with a first potential, another some of the power supply blocks are supplied with a second potential, and the second potential is higher than the first potential.

Beneficial Effects

The self-luminous display panel provided by the present disclosure may independently provide a higher grayscale display for the corresponding pixel circuits by dividing the power supply film into power supply blocks, thereby easily achieving the partition display of the self-luminous display panel.

DETAILED DESCRIPTION OF PREFERRED EMBODIMENTS

In order to make the purpose, technical solutions and effects of the present disclosure clear, the following further describes present disclosure in detail with reference to the drawings and embodiments. It may be understood that the specific embodiments described herein are only used to explain the present disclosure, and not used to limit the present disclosure.

Figure 1:
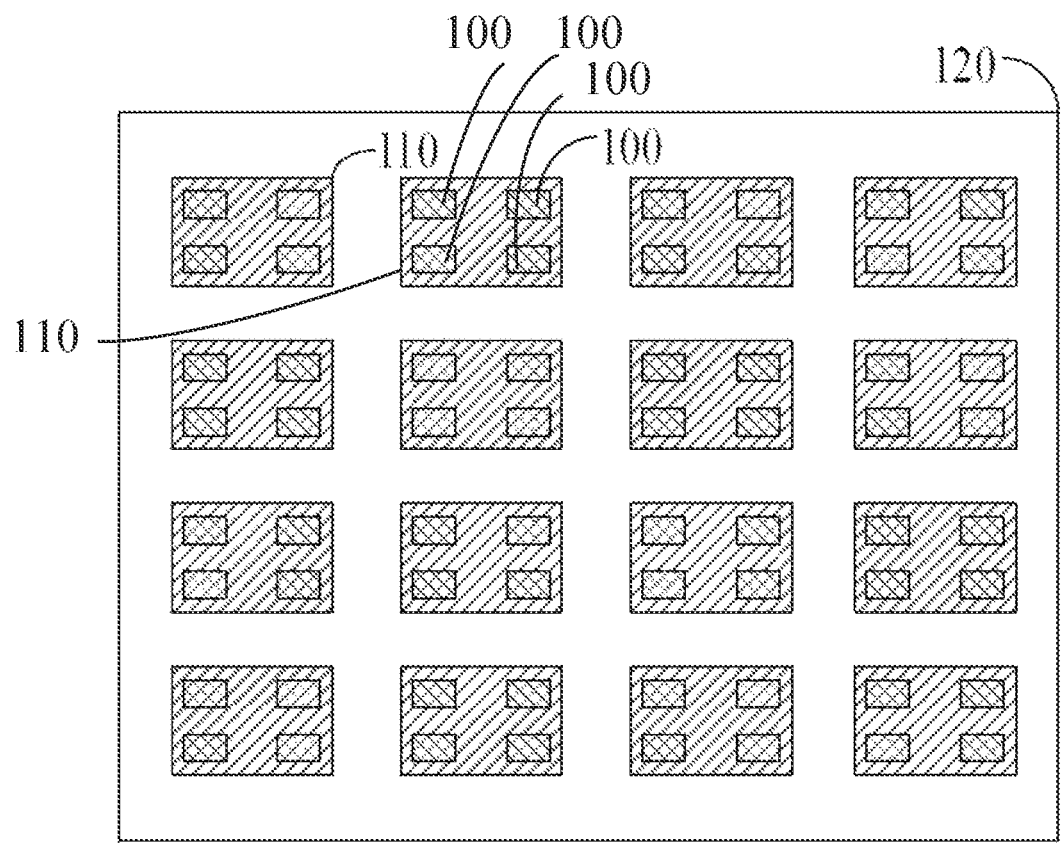
FIG. 1 is a structural schematic view of a self-luminous display panel provided by one embodiment of the present disclosure.
Figure 3:
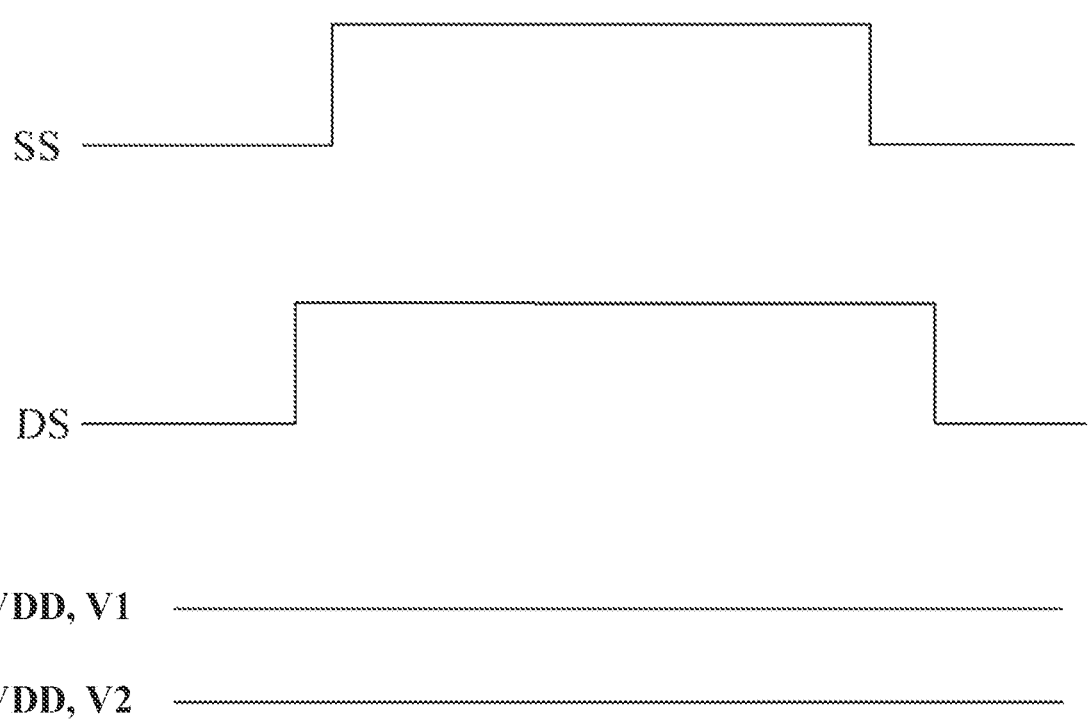
FIG. 3 is a timing schematic view of the pixel circuit shown in FIG. 2.

As shown in FIG. 1 or FIG. 3, the present embodiment provides a self-luminous display panel 120, which comprises a power supply film layer (not shown). The power supply film layer is divided into a plurality of mutually insulated power supply blocks 110. Each power supply block 110 is electrically connected to a plurality of pixel circuits 100 located in the power supply block 110. Some of the power supply blocks 110 are supplied with a first potential V1; another some of the power supply blocks 110 are supplied with a second potential V2, and the second potential V2 is higher than the first potential V1.

It is understood that a high potential is independently provided for the corresponding pixel circuits 100 as a light-emitting power by dividing the power supply film into power supply blocks 110, thereby achieving the high grayscale display. Moreover, it is easy to achieve the partition display of the self-luminous display panel 120. The self-luminous display panel 120 may display a detailed image with high grayscale, and the display with low grayscale is used for special image display with high contrast.

It should be noted that the power supply block 110 may be electrically connected to the corresponding pixel circuits 100 through a via hole; and the display panel 120 may provide different potentials to the corresponding film layer. For example, the first potential V1 and the second potential V2 may be provided to the corresponding power supply block 110 in the power supply film layer.

Figure 2:
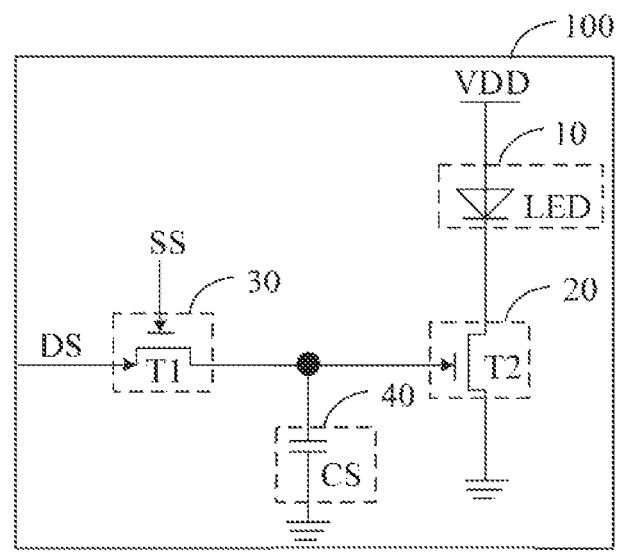
FIG. 2 is a structural schematic view of a pixel circuit shown in FIG. 1.

As shown in FIG. 2, in one of the embodiments, each pixel circuit 100 comprises a writing unit 30, a memory unit 40, a drive unit 20, and a light-emitting unit 10. The writing unit 30 is connected to a scan signal SS, a data signal DS, one end of the memory unit 40, and a control end of the drive unit 20. One end of the memory unit 40 is connected to the control end of the drive unit 20. Zero potential is connected to the other end of the memory unit 40 and an output end of the drive unit 20. An input end of the drive unit 20 is connected to an output end of the light-emitting unit 10. An input end of the light-emitting unit 10 is connected to a DC potential VDD. The DC potential VDD is electrically connected to the corresponding power supply block 110.

As shown in FIG. 2, in one of the embodiments, the writing unit 30 comprises a first thin film transistor T1. A drain of the first thin film transistor T1 is connected to the data signal DS. A gate of the first thin film transistor T1 is connected to the scan signal SS. A source of the first thin film transistor T1 is connected to one end of the memory unit 40 and the control end of the drive unit 20.

As shown in FIG. 2, in one of the embodiments, the memory unit 40 comprises a storage capacitor CS. A first end of the storage capacitor CS is connected to the source of the first thin film transistor T1 and the control end of the drive unit 20. A second end of the storage capacitor CS is connected to zero potential.

As shown in FIG. 2, in one of the embodiments, the drive unit 20 comprises a second thin film transistor T2. A gate of the second thin film transistor T2 is connected to the first end of the storage capacitor CS. A source of the second thin film transistor T2 is connected to zero potential. A drain of the second thin film transistor T2 is connected to the output end of the light-emitting unit 10.

As shown in FIG. 2, in one of the embodiments, the light-emitting unit 10 comprises a light-emitting device LED. A cathode of the light emitting-device LED is connected to the drain of the second thin film transistor T2. An anode of the light-emitting device LED is connected to the corresponding power supply block 110.

It is understood that the light-emitting device LED may be various diode-type light-emitting devices LED, and may be, but is not limited to, a mini-type, or a micro-type, or an organic electroluminescence-type LEDs.

In one of the embodiments, the first thin film transistor T1 and the second thin film transistor T2 are both N-type thin film transistors.

In one of the embodiments, a shape of the power supply block 110 may be, but is not limited to, rectangle, and may also be an ellipse shape, or other irregular shapes.

In one of the embodiments, the power supply block 110 is connected to the corresponding four pixel circuits 100. It may be understood that the connection of one power supply block 110 to the corresponding four pixel circuits 100 is not limited in the present embodiment. The power supply block 110 may be connected to the corresponding two circuits 100 or more.

As shown in FIG. 1, in one of the embodiments, the present disclosure provides a self-luminous display panel 120, which comprises a power supply film layer (not shown). The power supply film layer is divided into a plurality of mutually insulated power supply block 110. Each power supply block 110 is electrically connected to a different number of pixel circuits 100 located in the power supply block 110. Some of the power supply blocks 110 are supplied with a first potential V1, another some of the power supply blocks 110 are supplied with a second potential V2 is, and the second potential V2 is higher than the first potential V1.

It is understood that a high potential is independently provided for the corresponding pixel circuits 100 as a light-emitting power by dividing the power supply film into power supply blocks 110, thereby achieving the high grayscale display. Moreover, it is easy to achieve the partition display of the self-luminous display panel 120. The self-luminous display panel 120 may display a detailed image with high grayscale, and the display low grayscale is used for special image display with high contrast.

In summary, as shown in FIG. 3, when the first potential V1 supplies power to the DC potential VDD in the corresponding pixel circuits 100 through the power supply block 110, the corresponding pixel circuits 100 may achieve low grayscale display. When the second potential V2 supplies power to the DC potential VDD in the corresponding pixel circuits 100 through the power supply block 110, the corresponding pixel circuits 100 may achieve high grayscale display.

It is understood that for a person ordinarily skilled in the art, equivalent replacements or modifications may be performed according to the technical solution of the present disclosure and the inventive concept thereof, and all these modifications or replacements should fall within the claimed scope of the appended claims of the present disclosure.

What is claimed is:

1. A self-luminous display panel, wherein the self-luminous display panel comprises a power supply film layer; the power supply film layer is divided into a plurality of mutually insulated power supply blocks, and each power supply block is electrically connected to a plurality of pixel circuits located in the power supply block, and wherein some of the power supply blocks are supplied with a first potential that is a non-zero potential, another some of the power supply blocks are supplied with a second potential that is a non-zero potential, and the second potential is higher than the first potential;

wherein each pixel circuit comprises a writing unit, a memory unit, a drive unit, and a light-emitting unit;

wherein the writing unit is connected to a scan signal, a data signal, one end of the memory unit, and a control end of the drive unit; one end of the memory unit is connected to the control end of the drive unit; a zero potential is directly connected to the other end of the memory unit and an output end of the drive unit; an input end of the drive unit is connected to an output end of the light-emitting unit; an input end of the light-emitting unit is electrically connected to the corresponding power supply block;

wherein the memory unit comprises a storage capacitor, and an end of the storage capacitor is directly connected to a zero potential that is grounded;

wherein the drive unit comprises a first thin film and a second thin film transistor;

wherein a gate of the second thin film transistor is connected to the first end of the storage capacitor, a source of the second thin film transistor is directly connected to the zero potential that is grounded, and a drain of the second thin film transistor is connected to the output end of the light-emitting unit such that the second thin film transistor is connected between the light-emitting unit and the zero potential.

2. The self-luminous display panel according to claim 1, wherein a drain of the first thin film transistor is connected to the data signal; a gate of the first thin film transistor is connected to the scan signal; a source of the first thin film transistor is connected to one end of the memory cell and the control end of the drive unit.

3. The self-luminous display panel according to claim 2, wherein another end of the storage capacitor is connected to the source of the first thin film transistor and the control end of the drive unit.

4. The self-luminous display panel according to claim 1, wherein the light-emitting unit comprises a light-emitting device,
a cathode of the light-emitting device is connected to the drain of the second thin film transistor, and an anode of the light-emitting device is connected to the corresponding power supply block.

5. The self-luminous display panel according to claim 4, wherein the first thin film transistor and the second thin film transistor are both N-type thin film transistors.

6. The self-luminous display panel according to claim 1, wherein a shape of the power supply block is rectangular.

7. The self-luminous display panel according to claim 1, wherein the power supply block is connected to the four corresponding pixel circuits.

8. A self-luminous display panel, wherein the self-luminous display panel comprises a power supply film layer; the power supply film layer is divided into a plurality of mutually insulated power supply blocks, and each power supply block is electrically connected to a different number of pixel circuits located in the power supply block, and
wherein some of the power supply blocks are supplied with a first potential that is a non-zero potential, another some of the power supply blocks are supplied with a second potential that is a non-zero potential, and the second potential is higher than the first potential;

wherein each pixel circuit comprises a writing unit, a memory unit, a drive unit, and a light-emitting unit;

wherein the writing unit is connected to a scan signal, a data signal, one end of the memory unit, and a control end of the drive unit; one end of the memory unit is connected to the control end of the drive unit; a zero potential is directly connected to the other end of the memory unit and an output end of the drive unit; an input end of the drive unit is connected to an output end of the light-emitting unit; an input end of the light-emitting unit is electrically connected to the corresponding power supply block;

wherein the memory unit comprises a storage capacitor, and an end of the storage capacitor is directly connected to a zero potential that is grounded;

wherein the drive unit comprises a first thin film transistor and a second thin film transistor;

wherein a gate of the second thin film transistor is connected to the first end of the storage capacitor, a source of the second thin film transistor is directly connected to the zero potential that is grounded, and a drain of the second thin film transistor is connected to the output end of the light-emitting unit such that the second thin film transistor is connected between the light-emitting unit and the zero potential.

9. The self-luminous display panel according to claim 8, wherein a drain of the first thin film transistor is connected to the data signal; a gate of the first thin film transistor is connected to the scan signal; a source of the first thin film transistor is connected to one end of the memory cell and the control end of the drive unit.

10. The self-luminous display panel according to claim 9, wherein another end of the storage capacitor is connected to the source of the first thin film transistor and the control end of the drive unit.

11. The self-luminous display panel according to claim 8, wherein the light-emitting unit comprises a light-emitting device,
a cathode of the light-emitting device is connected to the drain of the second thin film transistor, and an anode of the light-emitting device is connected to the corresponding power supply block.

12. The self-luminous display panel according to claim 11, wherein the first thin film transistor and the second thin film transistor are both N-type thin film transistors.

13. The self-luminous display panel according to claim 8, wherein a shape of the power supply block is rectangular.

14. The self-luminous display panel according to claim 8, wherein the power supply block is connected to the four corresponding pixel circuits.

\* \* \* \* \*